United States Patent
Hill et al.

(10) Patent No.: US 7,583,715 B2
(45) Date of Patent: Sep. 1, 2009

(54) SEMICONDUCTOR CONDUCTIVE LAYERS

(75) Inventors: Peter O. Hill, Rio Rancho, NM (US); Larry R. Dawson, Albuquerque, NM (US); Philip Dowd, Mesa, AZ (US); Sanjay Krishna, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 360 days.

(21) Appl. No.: 11/153,245

(22) Filed: Jun. 15, 2005

(65) Prior Publication Data

US 2006/0027823 A1 Feb. 9, 2006

Related U.S. Application Data

(60) Provisional application No. 60/579,639, filed on Jun. 15, 2004.

(51) Int. Cl.
*H01S 5/00* (2006.01)
(52) U.S. Cl. ............... 372/45.011; 372/45.012; 372/43.01
(58) Field of Classification Search ............ 372/45.011, 372/45.012
See application file for complete search history.

(56) References Cited

U.S. PATENT DOCUMENTS

| 4,835,578 | A | * | 5/1989 | Ohtoshi et al. | ............... 257/15 |
| 5,856,685 | A | * | 1/1999 | Nakayama | ............... 257/192 |
| 7,312,474 | B2 | * | 12/2007 | Emerson et al. | ............... 257/96 |
| 2006/0017063 | A1 | | 1/2006 | Lester et al. | |

OTHER PUBLICATIONS

Borca-Tasciuc, T., et al., "Thermal conductivity of AlAs 0.07 Sb 0.93 and Al 0.9 Ga 0.1 As 0.07 Sb 0.93 alloys and (AlAs)1/(AlSb)11 digital-alloy superlattices", *Journal of Applied Physics*, 92 (9), (Nov. 1, 2002),4994-4998.

Felix, C. L., et al., "High-efficiency midinfrared 'W' laser with optical pumping injection cavity", *Applied Physics Letters*, 75(19), (Nov. 8, 1999),2876-2878.

Mourad, C., et al., "2 μm GaInAsSb/AlGaAsSb midinfrared laser grown digitally on GaSb by modulated-molecular beam epitaxy", *Journal of Applied Physics*, 88(10), (Nov. 15, 2000),5543-5546.

Pease, E. A., et al., "2.5-3.5 μm Optically Pumped GaInSb/AlGaInSb Multiple Quantum Well Lasers Grown on AlInSb Metamorphic Buffer Layers", *Journal of Applied Physics*, 93(6), (2003), 3177-3181.

Pease, E. A., "Mid-infrared GaInSb/AlGaInSb MQW lasers", *Thesis, University of New Mexico*, (May 2003), 107 pgs.

Pease, E. A., et al., "Mid-IR Lasers on AlInSb Metamorphic Buffers", *Presentation at 2002 Electronics Materials Conference*, (2002), 15 pgs.

Pease, E., et al., "Optically Pumped AlGaInSb/GaInSb Multiple Quantum Well Lasers", *Proceedings, 2002 Electronics Materials Conference*, (Abstract D4),(2002), p. 7.

* cited by examiner

*Primary Examiner*—Dung T Nguyen
(74) *Attorney, Agent, or Firm*—Schwegman, Lundberg & Woessner, P.A.

(57) ABSTRACT

Structures and methods for electronic devices with improved conductive regions are provided. The conductive region may include digital alloy superlattice structures, which allow higher doping levels to be achieved than for a bulk (random) alloy with the same average composition. Furthermore, the superlattice structures may improve the resistivity of the region, improving the current spreading of the region and hence the electronic properties of electronic devices such as optoelectronic devices.

60 Claims, 9 Drawing Sheets

SEMICONDUCTOR CONDUCTIVE LAYERS

RELATED APPLICATION

This application claims priority under 35 U.S.C. 119(e) from U.S. Provisional Application Ser. No. 60/579,639 filed 15 Jun. 2004, which application is incorporated herein by reference.

GOVERNMENT FUNDING

This invention was made with government support under Grant No. F49620-03-1-0437 awarded by the Air Force Office of Scientific Research. The United States Government has certain rights in the invention.

FIELD OF THE INVENTION

This invention relates to electronic devices, in particular, to semiconductor devices.

BACKGROUND OF THE INVENTION

With the recent increased interest in mid-wavelength infrared (hereinafter referred to as "MWIR") optoelectronic devices and applications, much attention has been directed to semiconductor optoelectronic devices, such as lasers, light emitting diodes (hereinafter referred to as "LEDs"), photodetectors, photodiodes, or the like. Particular concern has been directed to the area of lasers that operate at wavelengths between approximately 2 μm and 6 μm. Such devices are essential components in optical systems, which may be used for applications including remote sensing, LADAR, detection of chemical warfare agents, intelligence, surveillance and reconnaissance (ISR), enemy missile tracking and infrared countermeasures (IRCM).

An example of one such device is an edge-emitting laser (hereinafter referred to as an "EEL"), which may be used to provide a light signal in the above-mentioned optical systems. EELs typically include upper and lower contacting and cladding regions, formed on opposite sides of an active region. The EEL may be driven or pumped electrically by forcing current through the active region or optically by supplying light of a desired frequency to the active region.

In conventional telecommunication and data-communication EELs, typical device structures perform adequately. However, for MWIR applications, it is typically difficult to form structures with both good optical performance and, simultaneously, good electrical performance.

It is generally desirable to provide an EEL device with improved conductive regions that provide current flow through the active region of the device. Current flow is typically achieved by including highly doped layers in the EEL, on either side of the active region, allowing a high vertical current flow. However, sufficiently high doping levels can be difficult to achieve for some semiconductor materials used in MWIR devices, causing undesirable effects on current flow. In particular, n-type doping of InGaAlSb layers is a key problem in the realization of MWIR devices. It is difficult to achieve high electron concentrations in many compositions of this alloy since the ionization energy can be relatively high. Without adequate current flow, resistivity of devices increases and current injection can be non-uniform or exhibit current crowding effects, problems which can degrade optoelectronic device performance. Furthermore, growth of some semiconductor materials required for forming conductive regions is limited by the miscibility gap.

It would be highly advantageous, therefore, to remedy the foregoing and other deficiencies inherent in the prior art.

BRIEF DESCRIPTION OF THE DRAWINGS

Embodiments and features of the present invention will be set forth in part in the description which follows, and in part will become apparent to those skilled in the art by reference to the following description of the invention and referenced drawings. The aspects, advantages, and features of the invention are realized and attained by means of the instrumentalities, procedures, and combinations particularly pointed out in these embodiments and their equivalents.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments may be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Figure 1:
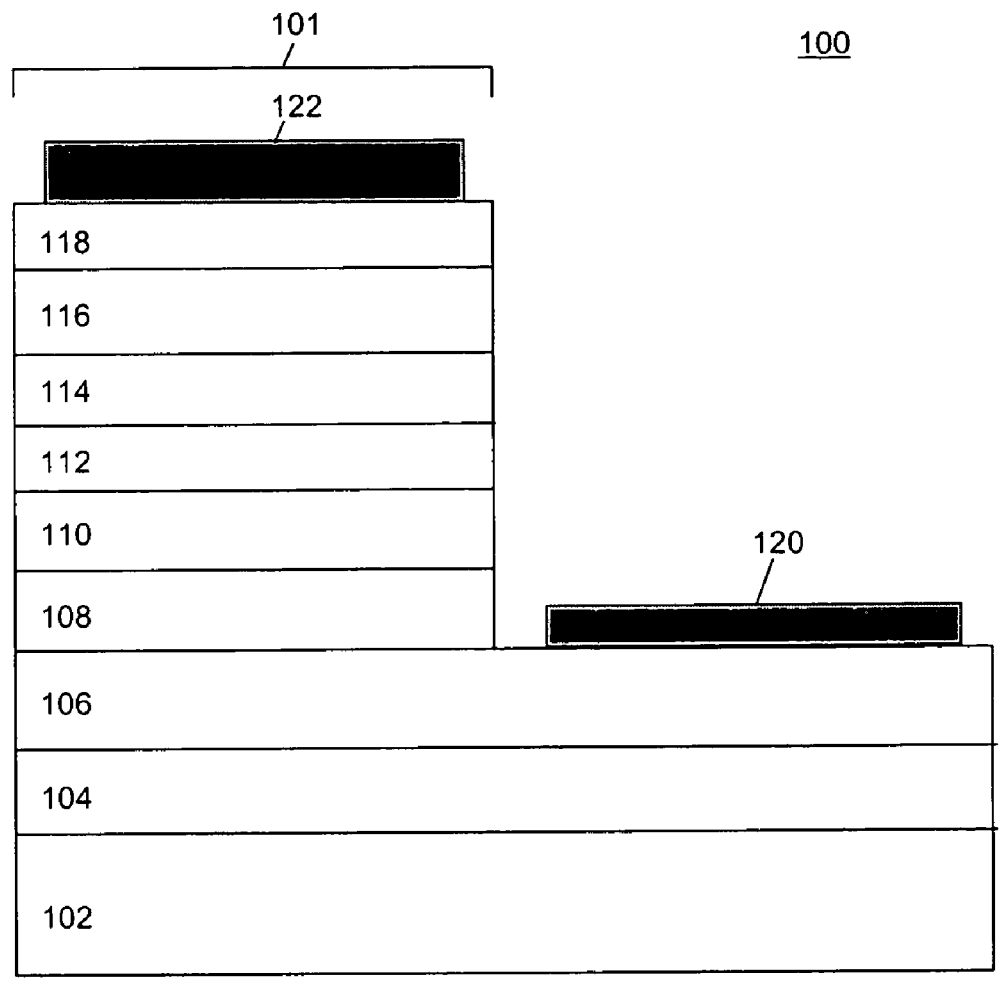
FIG. 1 is a plan view of an edge emitting laser in accordance with an embodiment of the present invention.

Turning now to FIG. 1, a sectional view of an edge emitting laser 100 is illustrated. EEL 100 is illustrated in an embodiment for simplicity and ease of discussion. However, it will be understood that other optoelectronic devices could be used and the illustration of EEL 100 is not meant to limit the scope of the invention. For example, a vertical-cavity surface-emitting laser, a quantum cascade laser, light emitting diode, or the like may also be used. As can be appreciated by those skilled in the art, optoelectronic devices include devices that provide light emission, light absorption, or light modulation.

In an embodiment, EEL 100 includes a substrate 102, wherein substrate 102 includes gallium antimonide (GaSb). However, it will be understood that substrate 102 may include other materials such as indium phosphide (InP), indium arsenide (InAs), gallium arsenide (GaAs), silicon (Si), an epitaxially grown material (such as a ternary or quaternary semiconductor), or the like. It will also be understood that substrate 102 typically includes a lattice constant chosen to minimize defects in materials subsequently grown thereon.

In an embodiment, a buffer region 104 is positioned on substrate 102. It will be understood that buffer region 104 may include more than one material layer, but is illustrated as including a single layer in an embodiment for simplicity and ease of discussion. In an embodiment, buffer layer 104 consists of a digital alloy (hereinafter referred to as "DA") semiconductor superlattice of InAlSb layers, designed to provide a low defect density. As understood by those skilled in the art, a digital alloy is an alloy with an average composition that is grown using two or more different semiconductor components. The average composition of the digital alloy depends on the thickness and composition of each of the constituent layer types used to form the superlattice. The superlattice layers are typically thin, of the order of 10-100 Angstrom, so that the resulting material has the properties of the average composition and not of the individual layers constituting the alloy. Further, buffer region 104 provides a lattice constant, which may be different from the lattice constant of substrate 102, and is chosen to minimize defects in materials subsequently grown thereon. However, it will also be understood that buffer region 104 may be formed in other semiconductor materials, including AlGaAs, InP and the like.

In an embodiment, conductive region 106 is positioned on buffer region 104. It will be understood that conductive region 106 may include more than one material layer, but is illustrated as including a single layer in an embodiment for simplicity and ease of discussion. Also in an embodiment, conductive region 106 includes highly doped semiconductor material with a conductivity type (i.e. n-type or p-type) to provide a lateral contact and current spreading. The design of conductive region 106 will be discussed separately.

In an embodiment, a cladding region 108 is positioned on conductive region 106 and a waveguiding layer 110 is positioned on cladding layer 108. An active region 112 is positioned on waveguiding region 110 wherein active region 112 includes a material capable of emitting a substantial amount of light at a desired wavelength of operation. As can be appreciated by those skilled in the art, an active region capable of emitting light is a light processing region. Other light processing regions include regions to absorb light and regions to modulate light. In an embodiment, the desired wavelength of operation is in a range given approximately from 2.0 µm to 5.0 µm. However, it will be understood that other wavelength ranges may be desired and will depend on the substrate material and the intended application.

Further, it will be understood that active region 112 may include various light emitting structures, such as quantum dots, quantum wells, or the like, which improve a light emitting efficiency of EEL 100. Also, it will be understood that active region 112 may include more than one material layer, but is illustrated as including a single layer in an embodiment for simplicity and ease of discussion.

In an embodiment, a waveguiding region 114 is positioned on active region 112 and a cladding region 116 is positioned on waveguiding region 114. In an embodiment, a conductive region 118 is positioned on cladding region 116. It will be understood that conductive semiconductor region 118 may include more than one material layer, but is illustrated as including a single material layer in an embodiment for simplicity and ease of discussion. Conductive region 118 includes highly doped semiconductor material with a conductivity type opposite to that of conductive contact region 106 (i.e. p-type or n-type). The design of conductive semiconductor region 118 will be discussed separately.

In an embodiment, blanket regions of material (i.e. regions 104, 106, 108, etc.) are typically positioned on substrate 102 sequentially so that a plurality of EELs may be formed in an array. However, only one such device (i.e. EEL 100) is illustrated for simplicity and ease of discussion. Also, in an embodiment, regions 104, 106, 108, etc. may be deposited using Molecular Beam Epitaxy, Metalorganic Chemical Vapor Deposition, or a similar technique well known by those skilled in the art.

In an embodiment, a ridge 101 is formed by etching through to conductive region 106 as shown. It will be understood that ridge 101 may be formed using techniques well known to those skilled in the art such as wet-etching, or dry-etching using inductance-coupled plasma (ICP) etching in an $Ar/Cl_2/BCl_3$ gas mixture, or the like.

A lower ohmic contact 120 may be formed on the etched, exposed conductive region 106 of EEL 100. An upper ohmic contact 122 may be formed on the conductive region 118 of EEL 100. It will be understood that ohmic contact regions 120 and 122 may include gold (Au), titanium (Ti), platinum (Pt), palladium (Pd), gold-germanium (Au—Ge), nickel, (Ni), metal alloys, or the like.

Figure 2:
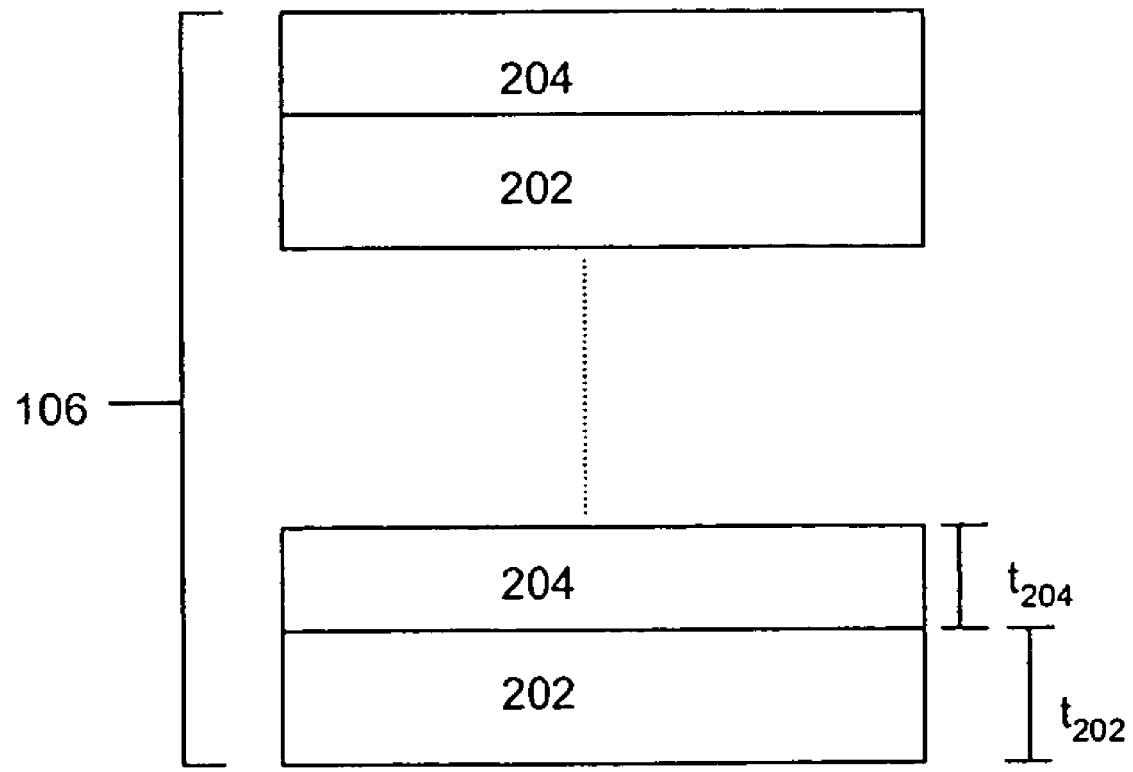
FIG. 2 is a plan view of a conductive region of an edge emitting laser in accordance with an embodiment of the present invention.

Turn now to FIG. 2 which shows a sectional view of conductive region 106, formed in accordance with an embodiment of the present invention. It will be understood that a similar discussion applies to conductive semiconductor region 118. However, only conductive semiconductor region 106 is discussed for simplicity and ease of discussion. In an embodiment, conductive region 106 includes two InAlSb layers 202 and 204, with thicknesses $t_{202}$ and $t_{204}$, respectively, wherein the composition of the layers is chosen to be different, and the thickness and composition of each layer provides an average composition of conductive region 106. In an embodiment, conductive region 106 has a single average composition. However, it will be understood that conductive region 106 may be formed using more than one region, each region having a different average composition, wherein the layer thicknesses and/or the layer compositions are varied.

It will also be understood that conductive region 106 may include more than two different layer types, wherein each layer type is periodically repeated through a superlattice. However, two layer types are illustrated for simplicity and ease of discussion. Conductive region 106 is typically between 0.5 and 10 µm thick, whereas the layer thicknesses $t_{202}$ and $t_{204}$ are typically of the order of several nanometers or tens of nanometers.

If conductive region 106 is grown as a bulk (random) alloy of an average composition, a poor carrier concentration, and hence inferior electrical properties, can be achieved, due to a high ionization energy for a dopant in the material. In an embodiment, the average composition of conductive region 106 is determined by the composition and the thickness of layers 202 and 204. The composition of the layers 202 and 204 is chosen such that at least one of layer 202 and layer 204 may include highly doped semiconductor material with a conductivity type (i.e. n-type or p-type) to provide a lateral contact and current spreading.

In the case where both layer 202 and layer 204 include highly doped semiconductor, a higher vertical current flow may also be achieved than is the case for a bulk (random) alloy. In the case where only one of layer 202 and layer 204 include highly doped semiconductor, the thickness of the lower-doped layer is chosen to be sufficiently thin so as to allow tunneling of carriers from the highly doped layer, permitting a higher vertical current flow than can be achieved than is the case for a bulk (random) alloy.

It will be understood that the doping of each layer of a superlattice may be chosen to be different, so that a vertical current flow and a lateral current flow may be varied throughout conductive region 106 in order to provide a desired current flow. In an embodiment, by way of example, a configuration may include a region with a high lateral current flow (relative to a vertical current flow) in a region of conductive region 106, and a high vertical current flow in another region of conductive region 106. Further, layers of the superlattice may be coherently strained, which may also yield higher mobilities than for bulk semiconductor.

Further, it will also be understood that conductive regions 106 or 118 may include alternative conductive structures, such as tunnel junction structures. The formation and operation of tunnel junction structures is well known to those skilled and will not be elaborated upon further here.

Figure 3:
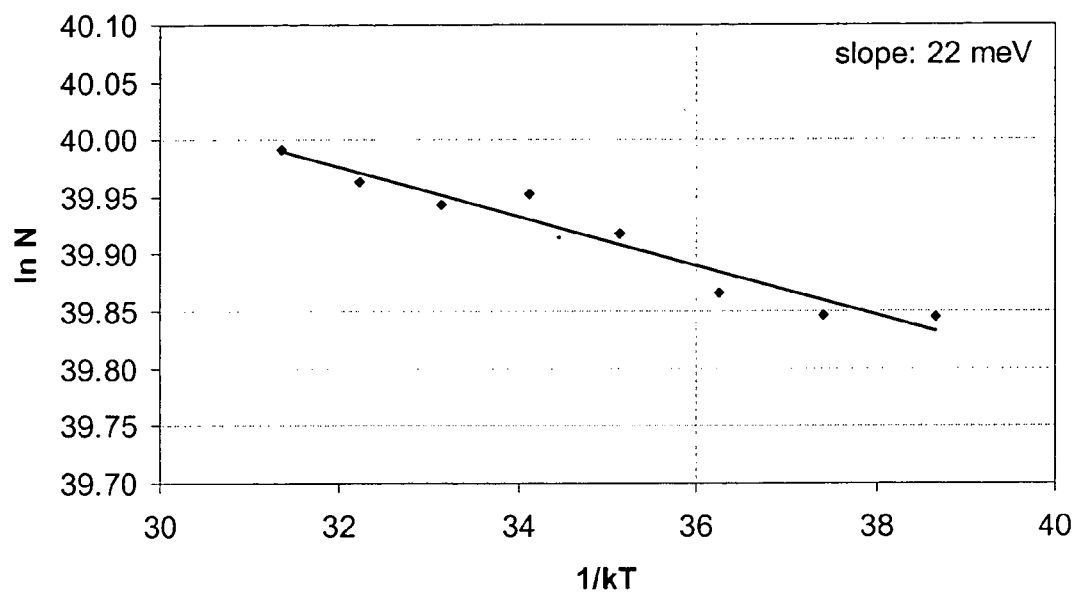
FIGS. 3, 4, and 5 are graphs of the log of the carrier concentration (N) as a function of temperature for $In_xAl_{1-x}Sb$ (x=0.0725, x=0.30 and x=0.555) layers, obtained by Hall measurements.

Turn now to FIG. 3 which illustrates a plot of the log of the carrier concentration (N) as a function of temperature for Te-doped $In_xAl_{1-x}Sb$ (x=0.0725). It should be noted that Te incorporation in the InAlSb material system is used by way of example only and is not meant to limit the scope of the invention. The doping level achieved is $2\times10^{17}$ cm$^{-3}$ and the activation (or ionization) energy is 22 meV, obtained from the slope of the characteristic Hall measurement curve. This is a relatively shallow energy level below the conduction band edge, allowing a sufficiently high free carrier concentration to be achieved.

Figure 4:
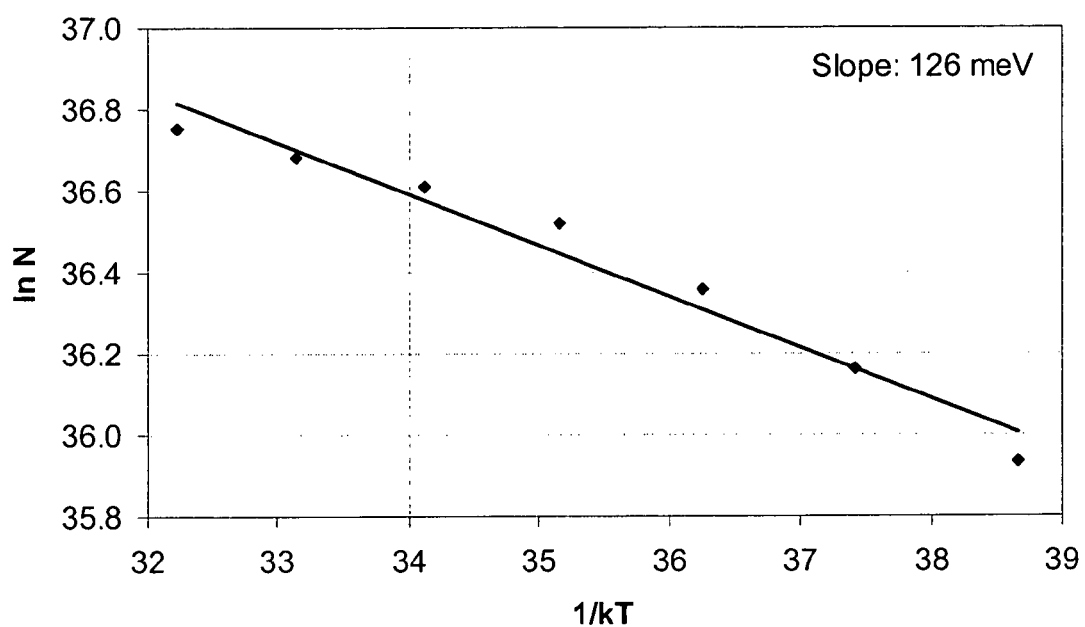

Turn now to FIG. 4 which illustrates a plot of the log of the carrier concentration (N) as a function of temperature for Te-doped $In_xAl_{1-x}Sb$ (x=0.3). The doping level achieved is $4\times10^{15}$ cm$^{-3}$ and the ionization energy is 126 meV. The high ionization energy causes fewer of the incorporated dopant atoms to be ionized, thus the resulting free carrier concentration is very low and is not suitable for producing high quality conductive layers.

Figure 5:
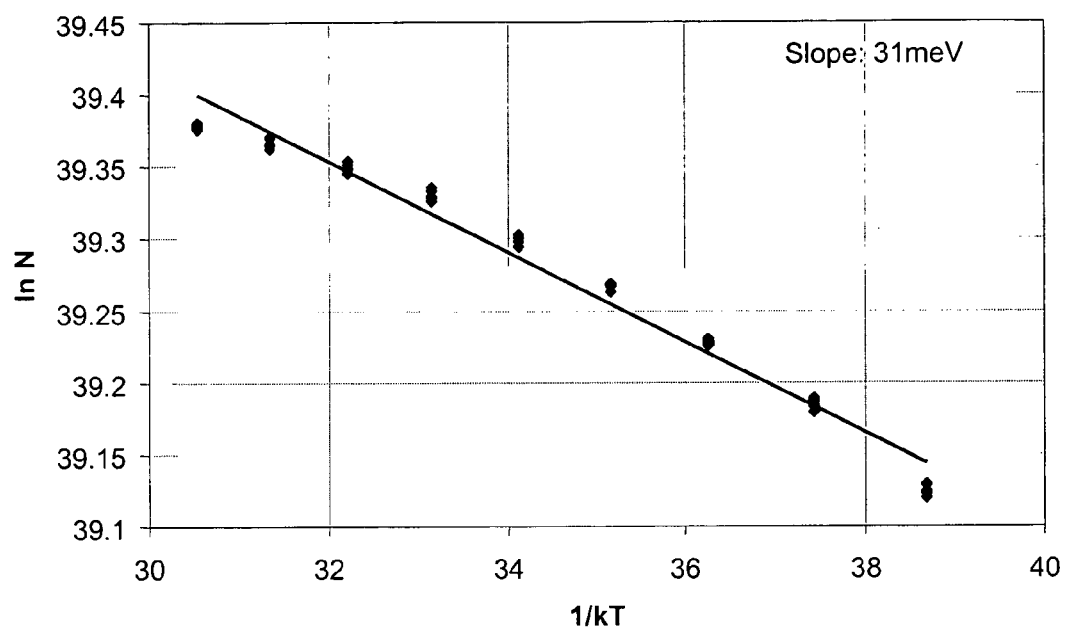

Turn now to FIG. 5 which illustrates a plot of the log of the carrier concentration (N) as a function of temperature for Te-doped $In_xAl_{1-x}Sb$ (x=0.555). The doping level achieved is $1\times10^{17}$ cm$^{-3}$ and the ionization energy is 31 meV. This ionization energy is sufficiently small such that a sufficiently high free carrier concentration may be achieved.

Figure 6:
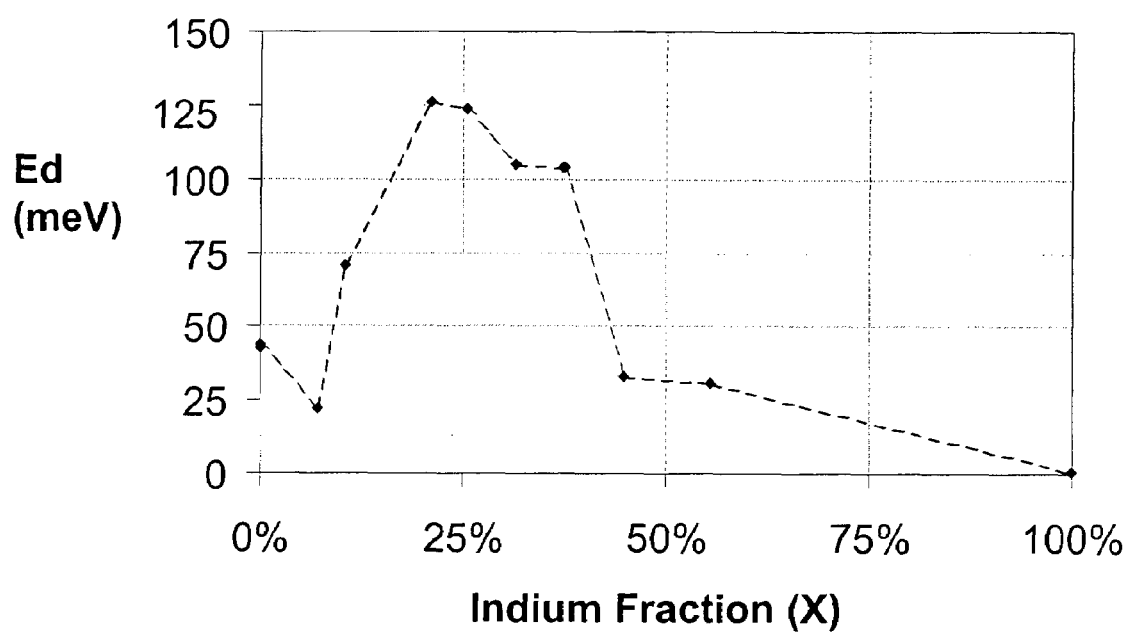
FIG. 6 is a plot of activation energy as a function of the composition of InAlSb.

Turn now to FIG. 6 which illustrates a plot of the ionization energy for Te-doped $In_xAl_{1-x}Sb$ as a function of composition. For compositions with x greater than approximately 0.45 and x less than approximately 0.1, the ionization (or activation) energy is less than about 40 meV. For compositions with x in the range of approximately 0.1<x<0.45, the ionization energy is of the order of 100 meV, indicating around 1% ionization, i.e. only 1% of the incorporated dopant atoms contribute to free carriers. Thus it is difficult to produce conductive bulk layers of $In_xAl_{1-x}Sb$, for this composition range. An average composition of $In_xAl_{1-x}Sb$ in the range approximately (0.1<x<0.45) may also be achieved by growth as a digital alloy using layers of $In_xAl_{1-x}Sb$ with compositions in the ranges of approximately x<0.1 and x>0.45. Since a dopant may be incorporated in these compositional ranges to allow higher carrier concentrations, it is possible to achieve layers with an average composition in the range of approximately (0.1<x<0.45) with improved electrical properties, when grown as a digital alloy, when compared to a bulk layer of the same average composition.

Figure 7:
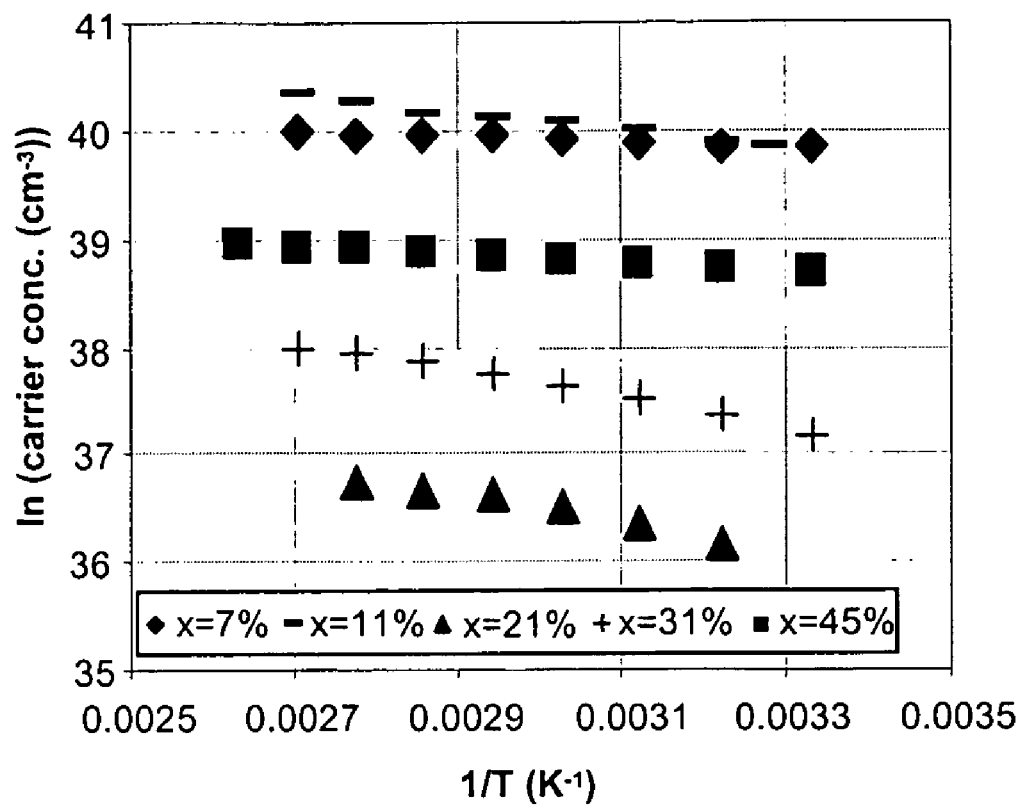
FIG. 7 is a plot of the log of the carrier concentration against inverse temperature for several compositions of Te-doped $In_xAl_{1-x}Sb$.

Turn now to FIG. 7, a plot of the logarithm of the carrier concentration as a function of inverse temperature for several compositions of Te-doped $In_xAl_{1-x}Sb$. For the compositions x=7%, x=11% and x=45%, the carrier concentrations are higher and the characteristic slopes are shallower than for x=21% and x=31%, indicating low activation energies and a relatively shallow donor for these compositions. A transition occurs between approximately 38% and 45% Indium content that causes the donors to become predominantly shallow.

Figure 8:
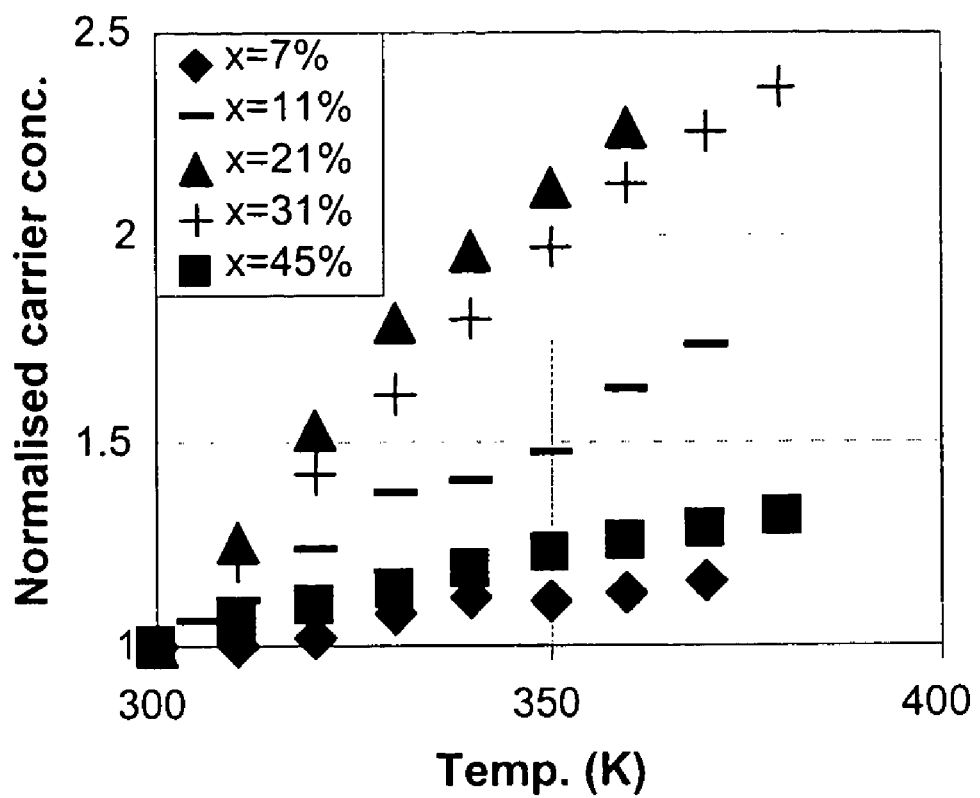
FIG. 8 is a plot of room temperature-normalized carrier concentration as a function of temperature for several compositions of Te-doped $In_xAl_{1-x}Sb$.
Figure 9:
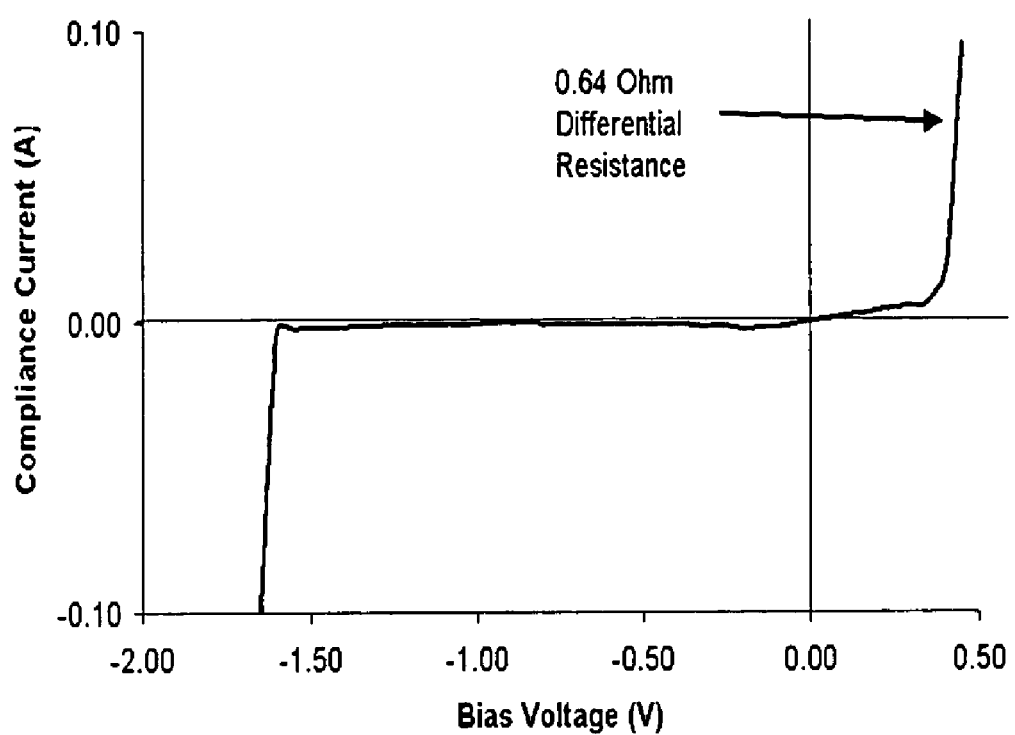
FIG. 9 is a plot of a current-voltage (I-V) relationship for a PIN diode fabricated using a superlattice of AlSb/$In_{0.50}Al_{0.50}Sb$.

Turn now to FIG. 8, a plot of room temperature-normalized carrier concentration as function of temperature for the same compositions of Te-doped $In_xAl_{1-x}Sb$ as shown in FIG. 7. Smaller slopes indicate a low temperature dependence of carrier concentration as a function of temperature, which indicates a low activation energy and hence a relatively shallow donor. For the compositions where x=0.07 (7%) and x=0.45 (45%), the slope of the characteristic curves is small, whereas for the compositions x=0.11 (11%), x=0.21 (21%), and x=0.31 (31%), the characteristic curves have a steep slope, indicating a high activation energy for a deep donor.

Thus semiconductor devices with improved conductive regions have been disclosed. In the case of an EEL, improved vertical current flow is achieved. The conductive region includes digital alloy superlattice structures which allow higher doping levels to be achieved than for a bulk (random) alloy with the same average composition. Furthermore, the superlattice structures improve the resistivity of the region, improving the current spreading of the region, and hence the electronic properties of optoelectronic devices.

Using Te-doped $In_xAl_{1-x}Sb$ in an embodiment, the ionization energy for free carriers for compositions approximately in the range 0.1<x<0.45 is of the order of 100 meV. This implies that only 1% of the incorporated dopants are electrically active and provide free carriers. For the compositions in the ranges approximately x<0.1 and x>0.45, however, the ionization energy is significantly lower, therefore resulting in higher free carrier concentrations, usable in optoelectronic and electronic devices.

To overcome the limitation of bulk $In_xAl_{1-x}Sb$ layers with compositions 0.1<x<0.45, in an embodiment an improved conductive region is formed by growing a digital alloy superlattice, where the thickness and compositions of the superlattice layers are chosen to provide the desired average compositions of the bulk alloy, and wherein at least one of the components of the superlattice has a low ionization energy such that high doping of that layer type may be achieved. Consequently, the conductivity of the superlattice conductive region is higher than that for a bulk alloy with the same average composition.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to claims associated with these embodiments, along with the full scope of equivalents to which such claims are entitled.

What is claimed is:

1. An electronic device comprising:
   a substrate;
   a conductive region disposed above the substrate, the conductive region having an average composition of indium aluminum antimonide, the conductive region including a first portion having a doped semiconductor material of a different composition of indium, aluminum, and antimonide from the average composition, the first portion doped to a level higher than a doping level of other portions of the conductive region; and
   an active region disposed above the substrate, the active region having material configured to emit light at a desired wavelength of operation, the active region disposed above or below the conductive region relative to the substrate.

2. The electronic device of claim 1, wherein the active region is coupled to the conductive region by a waveguiding layer.

3. The electronic device of claim 1, wherein the conductive region has an average composition of $In_xAl_{1-x}Sb$ with $0.1<x<0.45$.

4. The electronic device of claim 3, wherein the first portion include Te-doped $In_xAl_{1-x}Sb$ with $x<0.1$ or $x>0.45$.

5. The electronic device of claim 1, wherein the conductive region and the active region are configured in an edge-emitting laser.

6. The electronic device of claim 1, wherein the active region includes material configured to emit light at a wavelength in range of about 2 μm to about 6 μm.

7. The electronic device of claim 1, wherein the conductive region includes a second portion having a doped semiconductor material, the second portion doped lower than the first portion, the second portion configured to operatively provide tunneling of carriers from the first portion.

8. An electronic device comprising:
   a digital alloy semiconductor superlattice disposed above a substrate, the digital alloy semiconductor superlattice having:
      an average composition of indium aluminum antimonide; and
      a layer of semiconductor material having a composition of indium, aluminum, and antimonide different from the average composition, the layer of semiconductor material having a doping level higher than a level for other layers of the digital alloy semiconductor superlattice.

9. The electronic device of claim 8, wherein the digital alloy semiconductor provides a conductive layer configured to provide a vertical current path or a lateral current path in the electronic device.

10. The electronic device of claim 8, wherein the digital alloy semiconductor provides a conductive layer configured to provide a vertical current path and a lateral current path in the electronic device.

11. The electronic device of claim 8, wherein the digital alloy semiconductor superlattice is coherently strained.

12. The electronic device of claim 8, wherein the digital alloy semiconductor superlattice is coupled to a light processing layer disposed above the substrate.

13. The electronic device of claim 12, wherein the electronic device includes a buffer disposed on the substrate, the buffer configured to limit defects in materials disposed on the buffer layer.

14. The electronic device of claim 13, wherein the buffer layer includes a second digital alloy semiconductor superlattice.

15. The electronic device of claim 12, wherein the light processing layer includes an active region of a laser.

16. The electronic device of claim 15, wherein the laser includes an edge-emitting laser.

17. The electronic device of claim 15, wherein the laser includes a vertical-cavity surface-emitting diode or a quantum cascade laser.

18. The electronic device of claim 12, wherein the light processing layer includes the light processing layer of a light emitting diode.

19. The electronic device of claim 8, wherein the electronic device includes an optoelectronic device.

20. The electronic device of claim 19, wherein the optoelectronic device includes a mid-wavelength infrared optoelectronic device.

21. The electronic device of claim 19, wherein the optoelectronic device includes a photodetector.

22. The electronic device of claim 19, wherein the optoelectronic device includes a photodiode.

23. The electronic device of claim 19, wherein the optoelectronic device includes a light modulator.

24. The electronic device of claim 8, wherein the digital alloy semiconductor superlattice includes layers of indium aluminum antimonide.

25. The electronic device of claim 8, wherein the digital alloy semiconductor superlattice has an average composition of $In_xAl_{1-x}Sb$ with $0.1<x<0.45$.

26. The electronic device of claim 25, wherein the digital alloy semiconductor superlattice includes a layer of Te-doped $In_xAl_{1-x}Sb$ with $x<0.1$.

27. The electronic device of claim 25, wherein the digital alloy semiconductor superlattice includes a layer of Te-doped $In_xAl_{1-x}Sb$ with $x>0.45$.

28. An electronic device comprising:
   a digital alloy semiconductor superlattice disposed above a substrate, the digital alloy semiconductor superlattice being an antimonide-based structure, the digital alloy semiconductor superlattice having:
      an average composition;
      a first layer of semiconductor material having a composition different from the average composition; and
      a second layer of semiconductor material, wherein both the first layer of semiconductor material and the second layer of semiconductor material have a doping level higher than a level for other layers of the digital alloy semiconductor superlattice.

29. An electronic device comprising:
   a substrate;
   a superlattice having an average composition of indium aluminum antimonide, the superlattice having a first layer of doped semiconductor material of a different composition of indium, aluminum, and antimonide from the average composition, the first layer more highly doped than a doping level of other layers of the superlattice; and
   an active region, the active region having material configured to emit light at a desired wavelength of operation, the active region disposed above or below the superlattice relative to the substrate above which both the active region and the superlattice are disposed.

30. The electronic device of claim 29, wherein the active region is coupled to the superlattice by a waveguiding layer.

31. The electronic device of claim 29, wherein the superlattice and the active region are configured in an edge-emitting laser.

32. The electronic device of claim 29, wherein the active region includes material to emit light at a wavelength in range of about 2 µm to about 6 µm.

33. The electronic device of claim 29, wherein the superlattice includes a coherently strained digital alloy superlattice.

34. The electronic device of claim 29, wherein the superlattice includes a second layer of doped semiconductor material, the second layer having a doping level lower than that of the first layer, the second layer configured to operatively provide tunneling of carriers from the first layer.

35. The electronic device of claim 29, wherein the superlattice has a plurality of layers of varying composition and thickness to provide varied vertical current flow or lateral current flow throughout the superlattice.

36. The electronic device of claim 29, where the superlattice has an average composition of $In_xAl_{1-x}Sb$ with $0.1<x<0.45$.

37. The electronic device of claim 36, where the superlattice includes a layer of Te-doped $In_xAl_{1-x}Sb$ with $x<0.1$.

38. The electronic device of claim 36, where the superlattice includes a layer of Te-doped $In_xAl_{1-x}Sb$ with $x>0.45$.

39. The electronic device of claim 29, where the active region includes a quantum dot.

40. The electronic device of claim 29, where the active region includes a quantum well.

41. An electronic device comprising:
a substrate;
a superlattice having an average composition, the superlattice having a first layer of doped semiconductor material of a different composition from the average composition, the first layer more highly doped than a doping level of other layers of the superlattice;
an active region, the active region having material configured to emit light at a desired wavelength of operation, the active region disposed above or below the superlattice relative to the substrate above which both the active region and the superlattice are disposed; and
a conductive layer disposed opposite the superlattice relative to the active region, the conductive layer being another superlattice.

42. An electronic device comprising:
a substrate;
a superlattice having an average composition, the superlattice having a first layer of doped semiconductor material of a different composition from the average composition, the first layer more highly doped than a doping level of other layers of the superlattice, the superlattice having a plurality of layers of varying composition and thickness to provide varied vertical current flow or lateral current flow throughout the superlattice, wherein the plurality of layers are varied to provide in a first section of the superlattice a first lateral current flow higher than a first vertical current flow in the first section and in a second section of the superlattice a second vertical current flow higher than a second lateral current flow in the second section; and
an active region, the active region having material configured to emit light at a desired wavelength of operation, the active region disposed above or below the superlattice relative to the substrate above which both the active region and the superlattice are disposed.

43. An electronic device comprising:
a substrate;
a superlattice having an average composition, the superlattice having a first layer of doped semiconductor material of a different composition from the average composition, the first layer more highly doped than a doping level of other layers of the superlattice; and
an active region, the active region having material configured to emit light at a desired wavelength of operation, the active region disposed above or below the superlattice relative to the substrate above which both the active region and the superlattice are disposed, wherein the superlattice includes two $In_xAl_{1-x}Sb$ layers, the two $In_xAl_{1-x}Sb$ layers having different compositions from each other.

44. An electronic device comprising:
a substrate;
a superlattice having an average composition, the superlattice having a first layer of doped semiconductor material of a different composition from the average composition, the first layer more highly doped than a doping level of other layers of the superlattice; and
an active region, the active region having material configured to emit light at a desired wavelength of operation, the active region disposed above or below the superlattice relative to the substrate above which both the active region and the superlattice are disposed, wherein the superlattice includes a layer of Te-doped $In_xAl_{1-x}Sb$.

45. A method including:
forming a conductive region disposed above a substrate, the conductive region having an average composition of indium aluminum antimonide, the conductive region including a first portion having a doped semiconductor material of a composition of indium, aluminum, and antimonide different from the average composition, the first portion doped to a level higher than a doping level of other portions of the conductive region; and
forming an active region disposed above the substrate, the active region having material to emit light at a desired wavelength of operation, the active region disposed above or below the conductive region relative to the substrate.

46. The method of claim 45, wherein forming the conductive region includes forming a superlattice.

47. The method of claim 46, wherein forming a superlattice includes forming the superlattice having an average composition of $In_xAl_{1-x}Sb$ with $0.1<x<0.45$.

48. The method of claim 47, wherein forming the superlattice includes forming a Te-doped $In_xAl_{1-x}Sb$ layer with $x<0.1$ or $x>0.45$.

49. The method of claim 45, wherein the method includes forming a buffer on the substrate coupling the conductive region to the substrate.

50. A method including:
forming a conductive region disposed above a substrate, the conductive region having an average composition, the conductive region including a first portion having a doped semiconductor material of a composition different from the average composition, the first portion doped to a level higher than a doping level of other portions of the conductive region;
forming an active region disposed above the substrate, the active region having material to emit light at a desired wavelength of operation, the active region disposed above or below the conductive region relative to the substrate; and
forming a buffer on the substrate coupling the conductive region to the substrate, wherein forming the buffer includes forming a digital alloy semiconductor superlattice of InAlSb layers.

51. A method including:

forming a conductive region disposed above a substrate, the conductive region having an average composition, the conductive region including a first portion having a doped semiconductor material of a composition different from the average composition, the first portion doped to a level higher than a doping level of other portions of the conductive region;

forming an active region disposed above the substrate, the active region having material to emit light at a desired wavelength of operation, the active region disposed above or below the conductive region relative to the substrate; and forming a buffer on the substrate coupling the conductive region to the substrate, wherein the method includes:

forming the conductive region as a superlattice;

forming a first cladding layer on the conductive region;

forming a first waveguiding layer on the cladding region with the active region on the waveguiding layer; and forming a conductive layer above the active region.

52. The method of claim 51, wherein the method includes etching portions of the conductive layer, the active region, the first waveguiding layer, and the first cladding layer to expose a surface of the conductive region; and forming a contact on the surface of the conductive region exposed.

53. An electronic device comprising:

a first superlattice disposed above a substrate, the first superlattice being a conductive region having an average composition of indium aluminum antimonide, the first superlattice including a first layer of a doped semiconductor material having a different composition of indium, aluminum, and antimonide from the average composition, the first layer doped to a level higher than a doping level of the other layers of the first superlattice, the first superlattice having a first conductivity type;

a first cladding layer disposed on the first superlattice;

a first waveguiding layer disposed on the first cladding layer;

an active region disposed on the first waveguiding layer and above the substrate, the active region having material to emit light at a desired wavelength of operation;

a second waveguiding layer disposed on the active region;

a second cladding layer disposed on the second waveguiding layer; and a conductive layer disposed on the second cladding layer, the conductive layer having a second conductivity type different from the first conductivity type.

54. The electronic device of claim 53, wherein conductive layer includes a second superlattice, the second superlattice including a second layer of a doped semiconductor material, the second layer doped to a level higher than a doping level of the other layers of the second superlattice.

55. The electronic device of claim 53, wherein the active region has material to emit light at a wavelength in a range from about 2 µm to about 6 µm.

56. The electronic device of claim 53, wherein the electronic device includes:

a buffer layer disposed on the substrate, the buffer layer coupling the substrate to the first superlattice.

57. The electronic device of claim 56, wherein the buffer layer includes material having a lattice constant to limit defects in materials disposed on the buffer layer.

58. The electronic device of claim 56, wherein the buffer layer includes a digital alloy semiconductor superlattice of InAlSb layers.

59. The electronic device of claim 53, wherein the superlattice includes a digital alloy semiconductor superlattice with InAlSb layers.

60. The electronic device of claim 53, where the superlattice has an average composition of $In_xAl_{1-x}Sb$ with $0.1<x<0.45$ with a layer of Te-doped $In_xAl_{1-x}Sb$ having $x<0.1$ or $x>0.45$.

* * * * *

UNITED STATES PATENT AND TRADEMARK OFFICE
CERTIFICATE OF CORRECTION

PATENT NO. : 7,583,715 B2  Page 1 of 1
APPLICATION NO. : 11/153245
DATED : September 1, 2009
INVENTOR(S) : Hill et al.

It is certified that error appears in the above-identified patent and that said Letters Patent is hereby corrected as shown below:

On the title page, item (56), under "Other Publications", in column 2, line 17, delete "AIInSb" and insert -- AlInSb --, therefor.

In column 12, line 30, in Claim 58, delete "lnAlSb" and insert -- InAlSb --, therefor.

Signed and Sealed this

Twelfth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,583,715 B2
APPLICATION NO. : 11/153245
DATED : September 1, 2009
INVENTOR(S) : Hill et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 803 days.

Signed and Sealed this

Fourteenth Day of December, 2010

David J. Kappos
*Director of the United States Patent and Trademark Office*